United States Patent [19]
Bretl

[11] Patent Number: 4,829,523
[45] Date of Patent: May 9, 1989

[54] ERROR MASKING IN DIGITAL SIGNAL TRANSMISSION

[75] Inventor: Wayne E. Bretl, Schaumburg, Ill.

[73] Assignee: Zenith Electronics Corporation, Glenview, Ill.

[21] Appl. No.: 121,983

[22] Filed: Nov. 18, 1987

[51] Int. Cl.$^4$ .......................................... H03M 13/00
[52] U.S. Cl. ..................... 371/31; 341/110; 455/63
[58] Field of Search ............... 371/31, 43; 455/63, 455/52, 296; 375/26, 34, 99; 328/162, 165, 135, 149; 341/110

[56] References Cited

U.S. PATENT DOCUMENTS

| | | | |
|---|---|---|---|
| 3,569,934 | 3/1971 | Parr, Jr. | 371/31 |
| 4,047,151 | 9/1977 | Rydbeck et al. | 375/26 |
| 4,202,018 | 5/1980 | Stockham, Jr. | 371/31 |
| 4,291,405 | 9/1981 | Jayant et al. | 328/165 |

FOREIGN PATENT DOCUMENTS 1150771  4/1985  U.S.S.R. .................. 375/99

OTHER PUBLICATIONS

"Digital Audio Technology" by H. Nakajima et al., pp. 173-179, 1983.
"Digital Coding of Waveforms Principles and Applications to Speech and Video" by N.S. Jayant, 1984.

Primary Examiner—A. D. Pellinen
Assistant Examiner—Geoffrey S. Evans

[57] ABSTRACT

Masking is provided for any block of a transmitted digital signal which includes error signals caused by noise in the transmission channel. The digital signal may be an analog signal which has been digitized. When an erroneous block is detected, a masking signal is developed which is substituted for at least the erroneous block. The masking signal starts with the final value of the last error-free block and decays exponentially from that value until no longer needed. The substitution will continue through the erroneous block and may continue until the value of the substitute signal approaches the concurrent value of the subsequent signal block or until the values of the two signals actually crossover, or until there is a crossover with the slopes of the two signals having the same direction, i.e., rising or falling.

33 Claims, 4 Drawing Sheets

—PRIOR ART—

| BLOCK 1 (NO ERROR) | BLOCK 2 (CONTAINS ERROR) | BLOCK 3 (NO ERROR) |

2A

2B

2C

2D

2E

PRESENT INVENTION

ERROR MASKING IN DIGITAL SIGNAL TRANSMISSION

BACKGROUND OF THE INVENTION

This invention relates to the field of digital transmission and to means for minimizing the effect of errors in the reproduced signal caused by noise on the channel.

It is well known in the field of digitized transmission that, while gains may be made in reducing bandwidth, for example, the effects of noise in the channel may be so deleterious to the quality of the reproduced signal as to make the effort of doubtful value. Therefore, many methods have been tried to reduce or eliminate these effects. One approach has been to send the digital signals in such a manner as to essentially preclude errors from appearing in the final output. For example, in the U.S. Pat. No. 4,055,832, parity bits equal in number to the bits of the signal were sent so that the original signal could be reconstituted exactly, but with an inherent increase in bandwidth or in the required data rate.

As shown in the book "Digital Audio Technology" by Nakajima et al, 1985 TAB Books, Inc. the effects of error in the signal as received can be reduced in a number of ways. Typically, when a block of data is detected as containing error, it is deleted and a substitution is made. The substituted block may be a zero value signal, a signal having some nominal value less than the expected signal, or a repetition of the last previous good block of values. More sophisticated techniques have used the nearest valid values on each side of the erroneous block to create a parabolic curve of values which matches the valid information at the ends. In the case of a digitized audio signal, this latter type of approach reduces the clicks which might be noticed in the simpler forms of substitution, but requires substantial amounts of memory and calculation.

It is to be noted that, in the context of this description, "detection of error" typically means comparing an "update" value which is presumed to be correct with the corresponding received value.

OBJECTS OF THE INVENTION

It is an object of the present invention to minimize the effect of channel noise in a digitally transmitted analog signal.

It is a particular object to reduce these effects with a minimum of system and signal complexity.

BRIEF DESCRIPTION OF THE DRAWING

FIGS 3A, B and 3C are block/logic diagrams of one embodiment of the invention and of two elements thereof.

FIGS. 4A,B are a block/logic diagram of another embodiment of one element of FIG. 3A and an illustrative waveform diagram.

FIGS. 5A,B are a block/logic diagram of an added element for FIG. 4A and an illustrative waveform diagram.

DETAILED DESCRIPTION OF THE INVENTION

Figure 1:
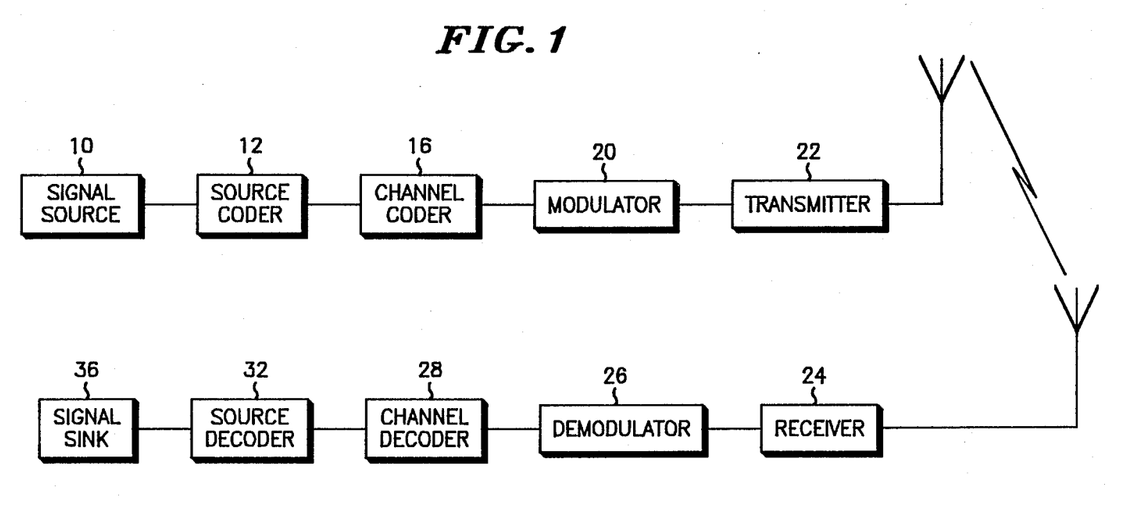
FIG. 1 is a simplified block diagram of a system utilizing the invention.

FIG. 1 shows a simplified block diagram of one possible system for the transmission and reception of digitized analog signals. It is to be noted that various other function blocks such as encrypters or frequency spreaders may be included in such systems, but only those blocks have been shown which are necessary for an understanding of the present invention.

A source 10 could be any source of analog signals such as a microphone but the system may also be used with a source of digital signals if desired. The signal source 10 is coupled to a source coder or formatter 12 which transforms the analog signal into a digital signal. This process usually involves sampling and quantizing the analog signal which may, for example, be an audio signal. In the present system it will also preferably include data compression using a form of Huffman code with variable word length codes. The source coder 12 will be discussed further hereinbelow.

A channel coder 16 receives the output of the source coder 12 and performs a number of functions, but for this description only the structuring of the bit stream into blocks will be discussed. The length of a block will depend on the allowed or desired bit rate and other factors. In the present invention, a block will preferably have from 32 to 128 samples plus at least one update. At a 32 kHz sampling rate, a block could range from 1-4 msec. In this context, an "update" will be understood to be a value which, because of the manner in which it is transmitted, is presumed to be an accurate value as received; for example, see Jayant and Noll, Digital Coding of Waveforms", Prentice-Hall Inc., 1982, section 6.7.4. The specific manner in which the update value is protected during transmission may be any reliable method and forms no part of the present invention.

A modulator 20 modulates the encoded signal developed at the output of the channel coder 16 onto a carrier by any suitable modulation method. A transmitting unit 22 transmits the signal to a corresponding receiving unit 24. It is to be noted that "transmit" as used herein does not necessarily signify "wireless" transmission.

The received signal is demodulated in a demodulator 26 and decoded in a channel decoder 28 and a source decoder 32 for use in whatever signal sink 36 is appropriate. In general, the processes of the two parts of the system are the inverse of each other as will be seen. Timing and control functions are required as is customary, but for the sake of brevity will not be shown or discussed here. To summarize the operation of the preferred source coder 12 of the transmitter, the coder samples the input analog signal and quantizes the samples. The differences between each sample and the previous sample are found and a first differential data stream is formed from those difference values. Then, taking that data stream, the process may be repeated to obtain a second differential data stream made up of the differences between the sequential values of the first data stream. Thus, in this embodiment, the information to be transmitted is mainly the second differential of the digital or digitized signal values, although a first differential could be used.

If the transmission channel were noise-free, decoding could be a straightforward process, more or less the inverse of the coding process. This requires one or two integrating circuits, corresponding to the transmission. Since, however, noise is likely to be present in the received signal, causing errors in the decoding process, the source decoder 32 should also include some means for minimizing the effects of such errors.

Figure 2:
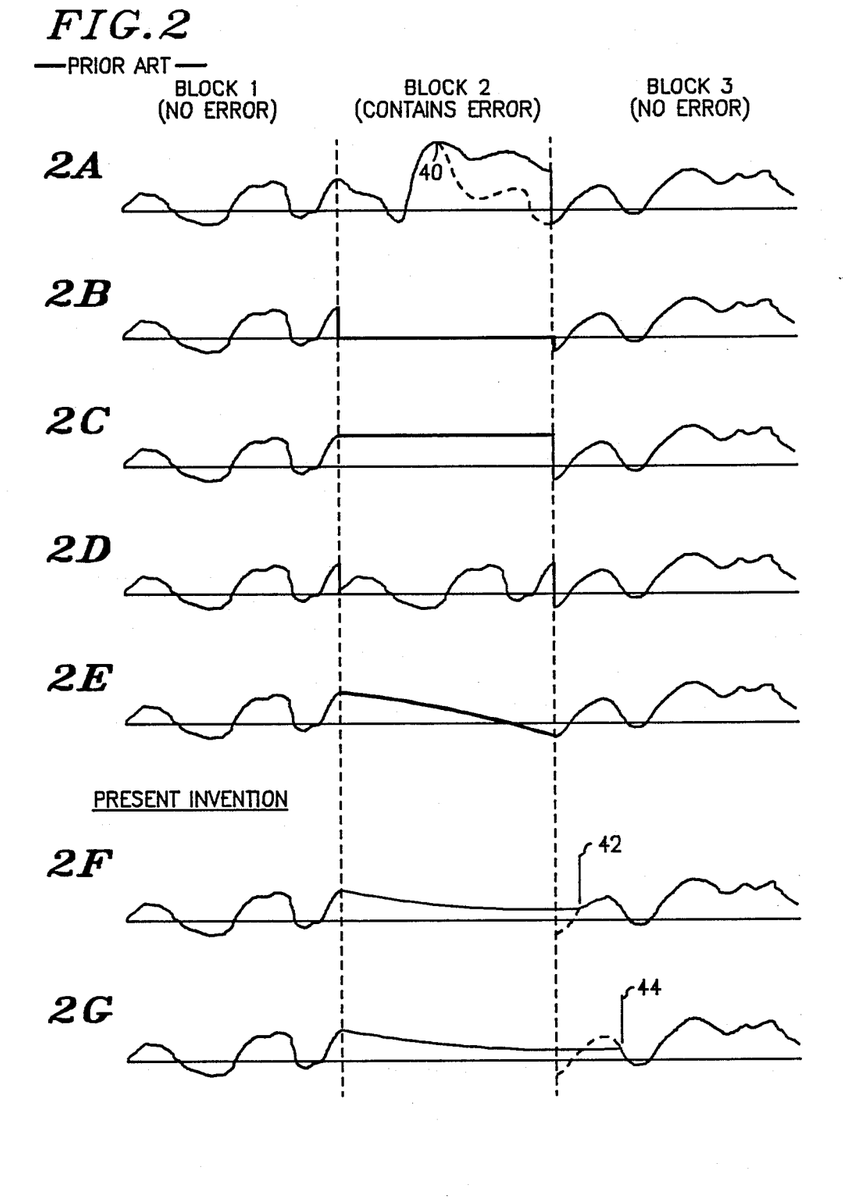
FIGS. 2A-2G show a plurality of waveforms illustrating the prior art and present solutions to the error problem.

FIG. 2 shows a series of waveforms which illustrate both some of the prior methods of reducing the effects of noise and those of the present invention. In the interest of clarity, only a representation of the output of the source decoder 32 is given here, with the updates and other signals being omitted. Each line of the drawing figure is based on the same received signal. Line 2A shows three blocks of the signal, uncorrected, with block 2 containing a noise-induced error (shown at point 40 of Line 2A). The dashed line indicates the shape of the signal if the error had not been present. At the end of block 2, an update signal would provide the correct final value, so that the error can be detected, and block three will not be affected by the error in block 2. However, in addition to having incorrect values in block 2, there could be a considerable effect due to the discontinuity between blocks 2 and 3.

Lines 2B-2E illustrate the prior art as discussed hereinabove. Line 2B. shows blocks 1 and 3 as decoded, with the erroneous block 2 replaced by a zero-valued signal. Line 2C is similar to line 2B, but with a substitution created by a sample-and-hold circuit so that the last value of the preceding good block of values is maintained until the beginning of block 3. It is easily seen that there will be some audible effects due to such substitutions, however, they are preferable to the effect of the noise-induced error. Line 2D illustrates the use of the last error-free block as a substitute for an erroneous block. This technique is again an improvement over the preceding ones; i.e. the effect is less noticeable. However, it can easily be seen in lines 2B, 2C and 2D that there are discontinuities which can cause annoying audio effects.

Line 2E shows an example of the prior art substitution of a parabolic-curve signal for the erroneous block. Since the curve is calculated from the last value of the preceding error-free block and the first value of the following block, there are no discontinuities at the ends of the substituted block, but there may still be quite noticeable effects, plus the calculation capability required may be considerable.

Lines 2F and 2G illustrate the signal correction resulting from the preferred modes of the present invention. As seen in line 2F, the erroneous block 2 has been deleted and a substitution made. To produce the substitution signal, the last value of block one is held in a sample-and-hold circuit which is "leaky"; that is, the stored value, instead of being held indefinitely as a constant value, is allowed to decay exponentially. During block 3, the values of the decaying curve are continuously compared with the concurrent values of block 3. When the values match or are within a preset tolerance, as at point 42, the substitution is discontinued and the actual signal is used. Thus, it will be seen, there are no discontinuities at either end of the substitution, and the resumption of the normal signal is done at a relatively low level, further reducing any noticeable effect. Preferred embodiments of this technique will be discussed with reference to FIGS. 3 and 4.

Figures 5A, 5B:
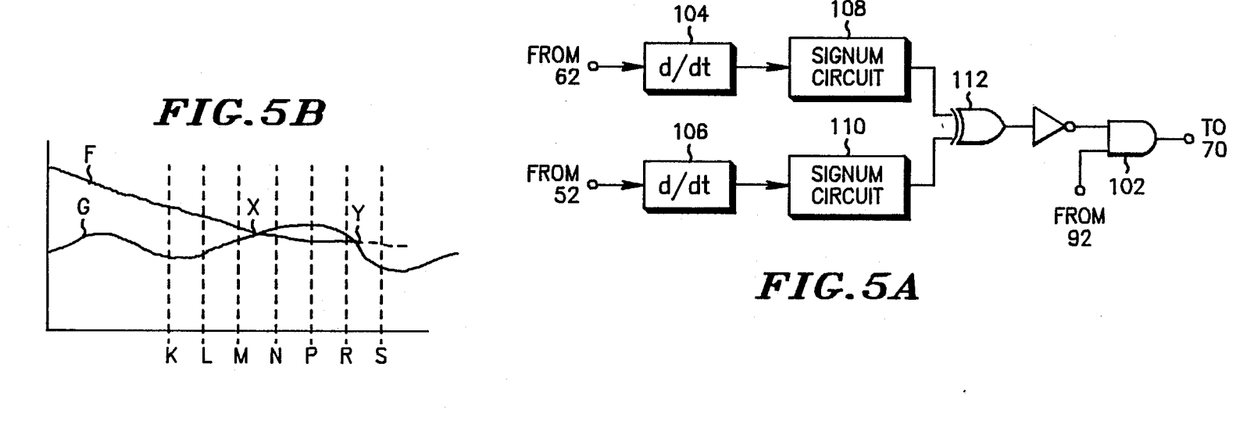

Line 2G is similar to line 2F in that the last value of the error-free block 1 is held by a leaky sample-and-hold and substituted for the erroneous block 2 and on into block 3 until the value of the decaying signal matches the value of the normal signal. However, in order to make the substitution even less noticeable, use of the decaying signal is continued until not only the two values match, but until the slopes of the two curves match in direction, as at point 44. The preferred embodiment providing the curve of FIG. 2G will be discussed with respect to FIGS. 5A,B. It is also possible to continue the substitution until both the direction and rate of the slopes match, but this technique may prolong the substitution period unduly without significant advantage.

Figures 3A, 3B, 3C:
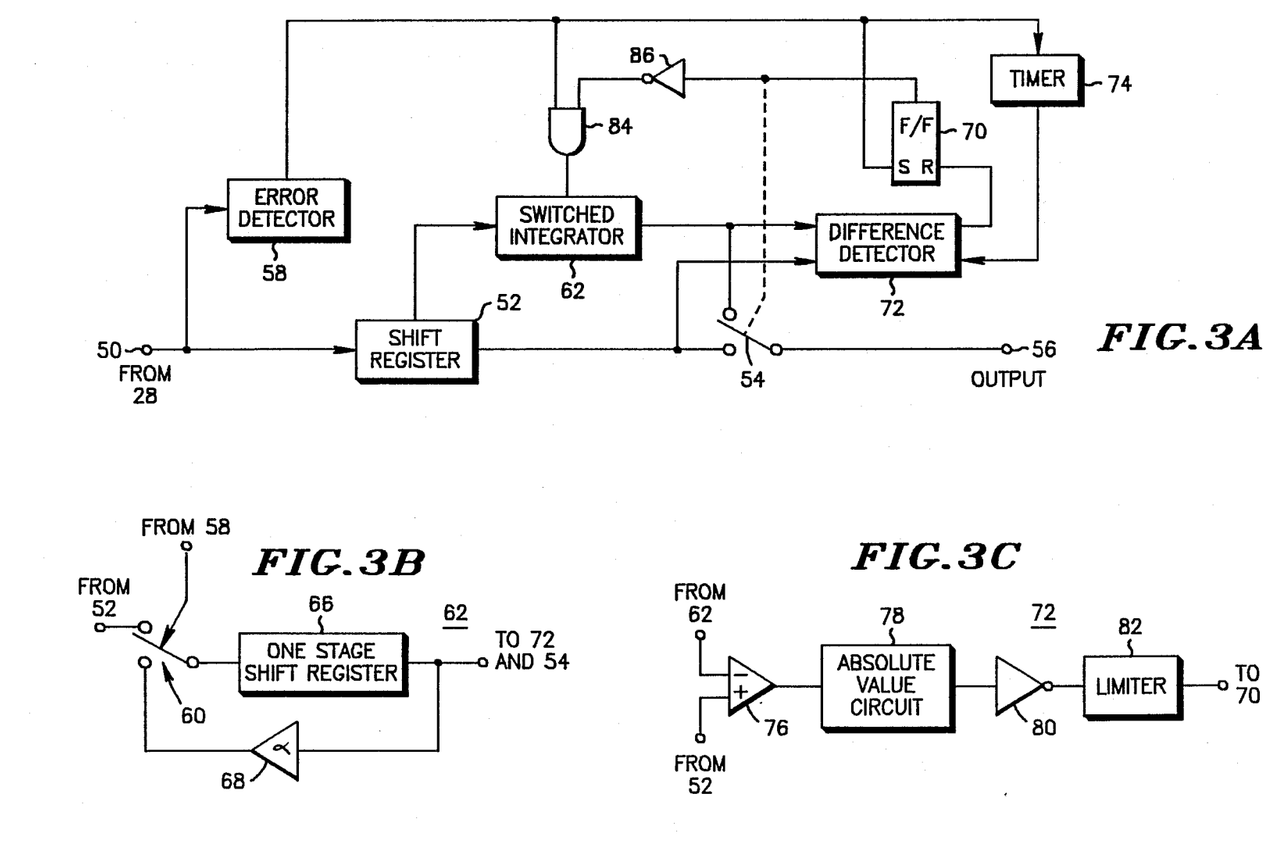

FIG. 3A is a block diagram of an embodiment which will produce the error-masking effect shown in line 2F of FIG. 2. At the input 50, the digital signal from the channel decoder 28 is received. As long as no error in present, the signal moves through a shift register 52 which is one block long and is then coupled through a switch 54 to an output terminal 56.

If, however, noise in the channel has caused an erroneous signal, as in block 2 of FIG. 2, an error detector 58 will have detected that error. As noted above, the method of detecting an erroneous block is not particularly relevant to the present invention. It is only necessary that the error detector, at the end of an erroneous block of signal, output a "error detect" signal sufficient to perform the required functions.

The error-detect signal from the error detector 58 is coupled to several points in the circuit, including the control element of a switch 60 (FIG. 3B) in an integrator 62. When the switch 60 is momentarily activated at an error detection, the output signal from the shift register 52 is momentarily coupled to an integrator circuit 62. At that point in time, the erroneous block 2 is stored in the shift register and at the output of the shift register is the last reliable sample of block 1. The integrator circuit 62 is one embodiment of the "leaky" sample-and-hold which is required here, as may be seen in FIG. 3B. The sample value entering from the shift register output is coupled through the switch 60 to a 1-stage shift register 66. The register output is coupled back to a second input of the switch 60 through an amplifier 68 having a gain α which is only slightly less than 1.0. The output of the integrator 62 will thus be seen to be, initially, the value of the sample from the shift register 52, then decaying exponentially as indicated for a minimum of one block period. This decaying signal is the signal to be substituted for the values of block 2. As mentioned above, timing functions are standard throughout this circuit and are not shown. While this substitution is made, the signal values of block 2 are shifted through the shift register 52, followed by the values of block 3. This shifting occurs at the normal rate so that after one block period, the first signal of block 3 is available for comparison in a difference detector 72 as described below.

The error-detect signal from error detector 58 is also coupled to the "set" input of a flip-flop 70. The output of the flip-flop is coupled to control the switch 54 so that the output of the integrator 62 is coupled to the output terminal 56 in place of the sample values of block 2 when an error has been detected. The difference detector 72 is coupled to receive both the output of the integrator 62 and the actual sample values, and is enabled by the error-detect signal from the error detector 58 through a timer 74, which has a timing period of one block. Thus, the difference detector will only be enabled at the beginning of block 3. One embodiment of the difference detector 72 as seen in FIG. 3C includes a comparator 76, for comparing the two input signals, a rectifier or absolute value circuit 78, an inverter 80 for changing to positive logic, and a limiter 82. The output of the difference detector 72 will therefore be "true" if the magnitude of the difference between the two inputs is less than a predetermined constant value K.

The output of the difference detector circuit 72 is coupled to the "reset" of the flip-flop 70, the output of the flip-flop being coupled to an AND gate 84 through an inverter 86. The second input of the AND 84 is provided by the error detector 58, and the AND output is the initializing signal for the integrator 62. This arrangement prevents the initialization of the integrator 62 in case of errors in successive blocks (which would introduce a discontinuity). In such a case, the timer 74 is restarted by the error detector 58, the flip-flop 70 remains set, and the output 56 is taken from the integrator 62 for an additional block.

The circuit of FIG. 3A could theoretically function down to a point where the value of K is zero or essentially zero. However, in practice, if K is chosen to be too small and one curve is crossing the other at a steep angle, both the preceding and following samples may be too different to enable switching of the signals at that point. For this reason a second embodiment of the difference detector 72 is given.

Figures 4A, 4B:
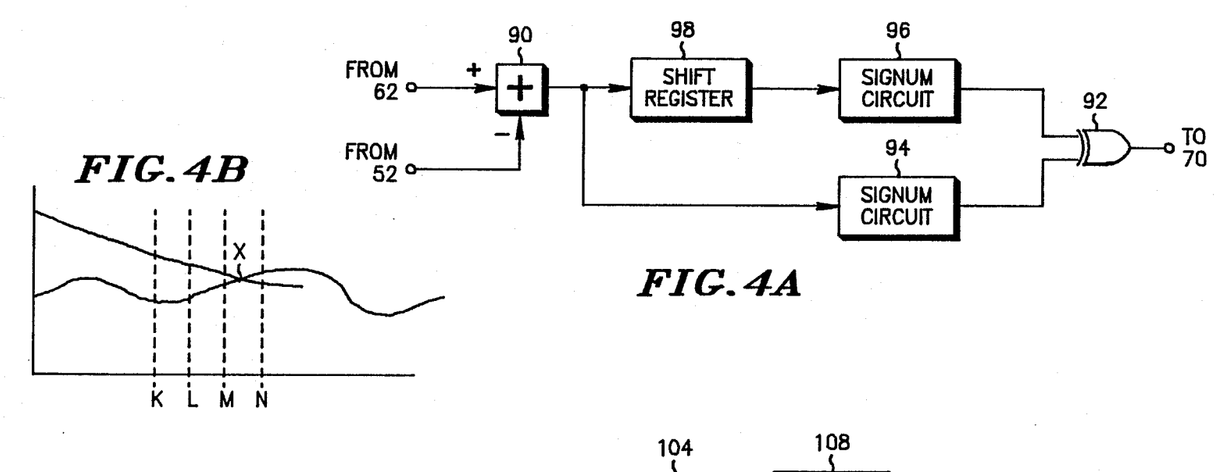

The circuit version shown in FIG. 4A functions similarly to that of FIG. 3C but, instead of returning to the received sample value as soon as the received value and the concurrent value of the substitute signal are nearly the same, the circuit looks for an actual crossover of the two signals before switching off the substitute signal. Again the two inputs are the output signals of the integrator 62 and the shift register 52. The difference between the two input signals is obtained by a negative adder 90 and the difference signal is coupled by two paths to an exclusive-OR gate 92. One path is through a limiter or signum circuit 94, providing only the sign of the difference signal. The second path is through a second signum circuit 96 but includes a one sample delay in a shift register 98. Thus, the EXOR gate 92 essentially compares the sign of each difference value with the sign of the preceding difference value. The waveforms are illustrated in FIG. 4B. where an error has previously occurred and the curve F of the signal from the integrator (or leaky sample-and-hold circuit) 62 approaches the curve G of the actual sample values of the block following the error. At the sample values K,L,M, the difference between the substitution curve F and the actual value G is positive but at the point N it has changed to negative. Therefore, a crossover has occurred at point "x" between M and N. The detection will cause the substitute curve to be deleted and the actual values to be used from there on.

FIG. 5A illustrates an embodiment of a version of the invention which not only looks for the error substitution curve and the actual sample curve to crossover, but also continues to use the substitution curve until the two curves have the same direction of slope. The circuit of FIG. 5A would be coupled in parallel to the crossover detect circuit of FIG. 4A, with the two outputs ANDed at an AND gate 102. Each of the inputs, from the integrator 62 and the shift register 52, is coupled to one of two differentiator circuits 104,106, respectively. Each differentiated signal, representing the rate of change of amplitude of one of the inputs, is then coupled to one of two signum circuits 108 and 110, respectively. The outputs of the signum circuits, giving only the sign of each input signals, are coupled to the inputs of an exclusive-OR gate 112 whose output is coupled through an inverter 114 to the AND gate 102. Thus, when the signs of the EXOR input signals change from being opposite to being the same, the EXOR outputs a "0" to the inverter 114, putting a "1" on the AND gate 102. Since the second input of the AND gate is from the crossover circuit of FIG. 4A, when the error substitution curve F crosses the actual sample curve G at the point "x" in FIG. 5B, the AND gate 102 will receive a logic "1" at that input. However, since the slopes of curves F an G are opposite in direction at the point x, the substitution will continue until the next crossover, at the point "y", where the slopes are in the same direction.

Note that it is quite possible to continue using the substitute curve until the two slopes match in both direction and rate. This further refinement would require adding another comparator to FIG. 5A to compare the magnitudes of the outputs of the differentiators 104,106, and coupling the comparator output to the AND gate 102. Since this feature appears to add additional complication without a substantial improvement in the signal, no corresponding diagram is shown.

Thus there has been shown and described a means of masking the effect of channel noise in a digitally processed and transmitted signal. The system utilizes the final sample of the last previous error-free block to produce an error substitution signal to replace the block of signal samples which contains the error. This substitution continues at least until the end of the erroneous block and until one other criteria is satisfied. It will be seen that, if an error is detected in the subsequent block of signal, the system will simply continue to substitute the decaying signal through that block period, then wait for the proper time to return to the actual signal.

While a particular embodiment of the invention has been shown and described, it will be obvious to those skilled in the at that changes and modifications may be made without departing from the invention in its broader aspects and, therefore, the aim in the appended claims is to cover all such changes and modifications as fall within the true scope of the invention.

What is claimed is:

1. A circuit for masking an error in a received block of digital signal and comprising:
   means for receiving blocks of digital signal:
   error detecting means for detecting an error in a block of received signal and providing an error detect signal in response thereto;
   means for storing the final value in the last good block of received signal prior to said erroneous block and allowing said final value to decay;
   switching means for coupling said received signal to an output terminal in response to a control signal and coupling said decaying signal to said output terminal in response to said error detect signal; and
   means responsive to said decaying signal and the block of signal subsequent to said erroneous block for providing said control signal upon detection of a predetermined relationship therebetween.

2. A circuit according to claim 1 wherein said means for providing said control signal comprises comparator means for comparing the concurrent values of said decaying signal and the block of signal subsequent to said erroneous block, said comparison beginning after said timed period, and providing said control signal in response to said compared signals approaching identical values.

3. A circuit according to claim 1 wherein said means for providing said control signal comprises timing means for timing a period equal to at least one block period and beginning at the end of said last good block of received signal.

4. The circuit according to claim 1 wherein an accurate update signal is sent at the end of each said block of signal and the error detecting means compares the final actual value of each block with the corresponding update value, a difference between said values resulting in said error detect signal.

5. The circuit according to claim 1 wherein the received digital signal comprises a digitized analog signal.

6. The circuit according to claim 1 wherein the storing means comprises a one-stage storage register and an amplifier coupling the output of the register back to the register input, said amplifier having a gain of slightly less than 1.0.

7. The circuit according to claim 1 wherein the storage means is enabled by the error detect signal.

8. A circuit for masking an error in a received block of digital signal and comprising:
receiving means for receiving the digital signal:
error detecting means for detecting an error in a block of received signal and providing an error detect signal in response thereto;
means for storing the final value in the last good block of data prior to said erroneous block and allowing said final value to decay;
switching means for coupling said received signal to an output terminal in response to a control signal and coupling said decaying signal to the output terminal in response to said error detect signal;
timing means for timing a period equal to at least one block period and beginning at the end of said last good block of received signal; and
means for determining the sign of the difference between each value of said decaying signal and the concurrent value of the subsequent block of signal, said determination beginning after the end of said timed period, and providing said control signal when the sign of said differences changes.

9. A circuit for masking an error in a received block of digital signal and comprising:
receiving means for receiving the digital signal:
error detecting means for detecting an error in a block of received signal and providing an error detect signal in response thereto;
means for storing the final value in the last good block of data prior to said erroneous block and allowing said final value to decay;
first switching means for coupling said received signal to an output terminal in response to a control signal and coupling said decaying signal to the output terminal in response to said error detect signal;
timing means for timing a period equal to at least one block period and beginning at the end of said last good block of received signal;
comparator means for comparing the concurrent values of said decaying signal and the block of signal following said erroneous block, said comparison beginning after said timed period, and providing a reset signal in response to said signals approaching identical values; and
second switching means for providing said first control signal in response to said reset signal.

10. A circuit for masking an error in a received block of digital signal and comprising:
receiving means for receiving the digital signal:
error detecting means for detecting an error in a block of received signal and providing an error detect signal in response thereto;
means for storing the final value in the last good block of data prior to said erroneous block and allowing said final value to decay;
switching means for coupling said received signal to an output terminal in response to a first control signal and coupling said decaying signal to the output terminal in response to said error detect signal;
timing means for timing a period equal to at least one block period and beginning at the end of said last good block of received signal;
first means for determining the sign of the difference between each value of said decaying signal and the concurrent value of the subsequent block of signal, said determination beginning after the end of said timed period, and providing a second control signal when the sign of said differences changes;
second means for determining the signs of the slopes of the decaying signal and the subsequent block of signal and providing a third control signal when said signs of the slopes are the same; and
control means for providing the first control signal in response to the second and third control signals.

11. A receiving unit for retrieving an analog signal which has at least been digitized, encoded and transmitted, and which includes at least one update value per block of signal, the unit comprising:
input means for receiving the transmitted signal;
demodulating means for demodulating the received signal;
decoding means for decoding the demodulated signal to provide an output signal;
detection means for utilizing said update signal to detect an error-containing block of said decoded signal;
masking means for utilizing the final value of the last error-free block prior to said error-containing block to provide an error-masking signal and allowing said signal to decay;
means for substituting said error-masking signal for at least said error-containing block of said output signal and further until a control signal is provided to allow the subsequent error-free blocks of signal to become said output signal;
means for providing said control signal when the difference between the values of said error-masking signal and the concurrent values of the block of signal subsequent to said error-containing block reaches a predetermined value; and
means for converting said output signal to provide said original analog signal.

12. A receiving unit for retrieving an analog signal which has at least been digitized, encoded and transmitted, and which includes at least one update value per block of signal, the unit comprising:
input means for receiving the transmitted signal;
demodulating means for demodulating the received signal;
decoding means for decoding the demodulated signal to provide an output signal;
detection means for utilizing said update signal to detect an error-containing block of said decoded signal;
masking means for utilizing the final value of the last error-free block prior to said error-containing block to provide an error-masking signal and allowing said signal to decay;

means for substituting said error-masking signal for at least said error-containing block of said output signal and further until a control signal is provided to allow the subsequent error-free blocks of signal to become said output signal;

means for providing said control signal when the concurrent values of said error-masking signal and the block of signal subsequent to said error-containing block reach identical values; and means for converting said output signal to provide said original analog signal.

13. A receiving unit for retrieving an analog signal which has at least been digitized, encoded and transmitted, and which includes at least one update value per block of signal, the unit comprising:

input means for receiving the transmitted signal;

demodulating means for demodulating the received signal;

decoding means for decoding the demodulated signal to provide an output signal;

detection means for utilizing said update signal to detect an error-containing block of said decoded signal;

masking means for utilizing the final value of the last error-free block prior to said error-containing block to provide an error-masking signal by allowing said final value signal to decay;

means for substituting said error-masking signal for at least said error-containing block of said output signal and further until a first control signal is provided to allow the subsequent error-free blocks of signal to become said output signal;

means for providing a second control signal when the concurrent values of said error-masking signal and the block of signal subsequent to said error-containing block reach identical values;

means for providing a third control signal when the slopes of said error-masking signal and said subsequent block of signal have the same direction;

means for providing said first control signal in response to said second and third control signals; and means for converting said output signal to provide said original analog signal.

14. A system for the transmission and reception of blocks of a digital signal and masking each received block which contains error due to noise in transmission, the system comprising:

source means for providing said digital signal;

means for including in each block of said signal a provision for error detection;

means for transmitting said blocks of signal;

means for receiving said transmitted signals;

error detecting means for detecting any block containing error due to said noise and providing an error detect signal in response to said detection;

means for storing the final value in the last good block of received signal prior to said erroneous block, and allowing said final value to decay;

means for coupling said received signal to an output terminal in response to a control signal and coupling said decaying signal to said output terminal in response to said error detect signal;

timing means for timing a period equal to at least one block period and beginning at the end of said last good block of received signal; and comparator means for comparing the concurrent values of said decaying signal and the block of signal following said erroneous block, said comparison beginning after said timed period, and providing said control signal in response to said compared signals having a predetermined relationship.

15. A system for the transmission and reception of blocks of a digital signal and masking each received block which contains error due to noise in transmission, the system comprising:

source means for providing said digital signal;

means for including in each block of said signal a provision for error detection;

means for transmitting said blocks of signal;

means for receiving said transmitted signals;

error detecting means for detecting any block containing error due to said noise and providing an error detect signal in response to said detection;

means for providing a substitute signal including single stage storage means for storing the final value in the last good block of received signal prior to said erroneous block and amplifier means for coupling the output of said storage means back to the storage means input, said amplifier means having a gain of slightly less than 1.0;

means for coupling said received signal to an output terminal in response to a control signal and coupling said substitute signal to said output terminal in response to said error detect signal;

timing means for timing a period equal to at least one block period and beginning at the end of said last good block of received signal; and comparator means for comparing the concurrent values of said decaying signal and the block of signal following said erroneous block, said comparison beginning after said timed period, and providing said control signal in response to said compared signals having a predetermined relationship.

16. A system for the transmission and reception of a digital signal, the system comprising:

source means for providing said digital signal;

channel coding means for dividing said digital signal into blocks and providing an error-immune update signal for the last value of each block;

means for transmitting said digital signal and said update signal of each block;

means for receiving said transmitted signals;

error detecting means for utilizing said update signals to detect any error in a block due to said channel noise and providing an error detect signal;

means for providing a substitute signal including single stage storage means for storing the final value in the last good block of received signal prior to said erroneous block and amplifier means for coupling the output of said storage means back to the storage means input, said amplifier means having a gain of slightly less than 1.0;

means for coupling said received signal to an output terminal in response to a control signal and coupling said substitute signal to said output terminal in response to said error detect signal;

timing means for timing a period equal to at least one block period and beginning at the end of said last good block of received signal; and comparator means for providing said control signal in response to the concurrent values of said decaying signal and the block of signal following said erroneous block approaching identical values, said provision beginning after said timed period.

17. The system according to claim 16 wherein said comparator means includes; means for obtaining the difference between said signals, means for obtaining the absolute value of the difference, and means for limiting said absolute value.

18. The system according to claim 16 and further including encoding means for encoding said digital signal and said update signal prior to transmission, and decoding means for decoding said signals after transmission.

19. The system according to claim 16 wherein said transmitting means includes modulating means for modulating at least said digital signal and said update signal onto a carrier frequency signal, and said receiving means includes demodulating means.

20. A system for the transmission and reception of blocks of a digital signal and masking each received block which contains error due to noise in transmission, the system comprising:
   source means for providing said digital signal;
   channel coding means for dividing said digital signal into blocks and providing an error-immune update signal for the last value of each block;
   means for transmitting said digital signal and said update signal of each block;
   means for receiving said transmitted signals;
   error detecting means for utilizing said received signals to detect any error due to said channel noise and providing an error detect signal in response to said detection;
   means for providing a masking signal by storing the final value in the last good block of received signal prior to said erroneous block and allowing said final value to decay;
   means for coupling said received signal to an output terminal in response to a control signal and coupling said masking signal to the output terminal in response to said error detect signal;
   timing means for timing a period equal to at least one block period and beginning at the end of said last good block of received signal; and
   means for determining the sign of each difference between a value of the masking signal and the concurrent value of the subsequent block of signal, said determination beginning after said timed period, and providing said control signal when said sign changes.

21. The system according to claim 20 wherein the determining means includes means for subtracting one said value from the other of said values to obtain the difference, first signum means for obtaining the sign of said difference, means for delaying said difference, and second signum means for obtaining the sign of the delayed difference.

22. The system according to claim 21 and wherein the determining means further includes means coupled to said first and second signum means for detecting when said signs are different.

23. A system for the transmission and reception of blocks of a digital signal and masking each received block which contains error due to noise in transmission, the system comprising:
   source means for providing said digital signal;
   channel coding means for dividing said digital signal into blocks and providing an error-immune update signal for the last value of each block;
   means for transmitting said digital signal and said update signal of each block;
   means for receiving said transmitted signals;
   error detecting means for utilizing said received signals to detect any error due to said channel noise and providing an error detect signal in response to said detection;
   means for providing a masking signal by storing the final value in the last good block of received signal prior to said erroneous block and allowing said final value to decay;
   means for coupling said received signal to an output terminal in response to a first control signal and coupling said masking signal to the output terminal in response to said error detect signal;
   timing means for timing a period equal to at least one block period and beginning at the end of said last good block of received signal;
   first means for determining the sign of the difference between each value of said masking signal and the concurrent value of the subsequent block of signal, said determination beginning after said timed period, and providing a second control signal when said sign changes;
   second means for determining the signs of the slopes of said masking signal and the subsequent block of signal and providing a third control signal when said signs of the slopes are the same; and
   control means for providing said first control signal in response to the second and third control signals.

24. The system according to claim 23 wherein the second means for determining the signs of the slopes includes a first means for differentiating said masking signal and providing a first differentiated signal;
   a first signum circuit for providing the sign of said first differentiated signal,
   a second means for differentiating said subsequent block of signal and providing a second differentiated signal;
   a second signum circuit for providing the sign of said second differentiated signal; and
   logic means for providing an output signal when said signs are the same.

25. A system for the transmission and reception of a digitally processe analog signal comprising:
   source means for providing said analog signal;
   processing means for digitizing said analog signal;
   channel coding means for dividing said digitized signal into blocks and providing an update signal for the last value of each block, said update signal being essentially errorimmune; immune;
   means for transmitting at least said blocks of signal including said update signal;
   means for receiving said transmitted signals;
   error detecting means for utilizing said update signal to detect any block containing error due to said noise and providing an error detect signal in response to said detection;
   means for storing the final value in the last good block of received signal prior to said erroneous block, and allowing said final value to decay;
   means for coupling said received signal to an output terminal in response to a control signal and coupling said decaying signal to said output terminal in response to said error detect signal;
   timing means for timing a period equal to at least one block period and beginning at the end of said last good block of received signal;

comparator means for comparing the concurrent values of said decaying signal and the block of signal following said erroneous block, said comparison beginning after said timed period, and providing said control signal in response to said compared signals having a predetermined relationship; and means for converting said output signal to provide said analog signal.

26. A method for masking the effect of noise in the transmission channel on a received digital signal and comprising the steps of:

examining each block of received signal and detecting an erroneous block;

uncoupling said received signal from an output terminal when an error detection is made;

storing the final value of the last valid block of signal and allowing said final value to decay to provide a masking signal;

coupling said masking signal to said output terminal during at least the erroneous block of signal; and coupling the subsequent block of signal to said output terminal in response to the detection of a predetermined relationship between said subsequent block of signal and said masking signal.

27. The method according to claim 26 and wherein the step of coupling the subsequent block to the output terminal comprises the step of comparing each masking signal value with the concurrent value of the subsequent block of signal.

28. A method for masking the effect of noise in the transmission channel on a received digital signal and comprising the steps of:

examining each block of received signal and detecting any erroneous block;

uncoupling said received signal from an output terminal when an error detection is made;

storing the final value of the last valid block of signal and allowing said final value to decay to provide a masking signal;

coupling said masking signal to said output terminal during at least the erroneous block of signal;

determining the sign of the difference between each value of the masking signal and the concurrent value of the subsequent block of signal; and coupling the values of said subsequent block of signal to said output terminal when the sign of the difference between said compared values changes.

29. The method according to claim 26 wherein the step of determining the sign of the difference includes the steps of:

subtracting each value of one signal from the concurrent value of the other signal;

coupling the difference signal to a first signum circuit to provide a first signum signal;

coupling the difference signal through a one-stage delay to a second signum circuit to provide a second signum signal; and coupling the first and second signum signals to an exclusive-OR gate.

30. The method according to claim 28 wherein the step of determining the sign of the difference includes the steps of;

subtracting each value of one signal from the concurrent value of the other signal to provide a difference signal;

determining the sign of each value of the difference signal;

comparing the sign of each value of said difference signal to the sign of the subsequent value; and detecting a change of sign between susequent values of said difference signal.

31. A method for masking the effect of noise in the transmission channel on a received digital signal and comprising the steps of:

examining each block of received signal and detecting any erroneous block;

uncoupling said received signal from an output terminal when an error detection is made;

storing the final value of the last valid block of signal and allowing said final value to decay to provide a masking signal;

coupling said masking signal to said output terminal during at least the erroneous block of signal;

determining when the sign of the difference between each value of the masking signal and the concurrent value of the subsequent block of signal changes;

determining when the signs of the slopes of the masking signal and the subsequent block of signal are the same; and coupling the values of said subsequent block of signal to said output terminal when the sign of the difference between said compared values changes and the signs of said slopes are the same.

32. The method according to claim 31 wherein the step of determining when the signs of the slopes of the two signals are the same includes the steps of:

determining the slope of each signal;

determining the sign of the slope of each signal; and comparing the signs of the two slopes.

33. The method according to claim 32 wherein the step of determining when the signs of the slopes of the two signals are the same further includes the step of providing a first detect signal, wherein the step of determining when the sign of the difference between the values of the two signals changes includes the step of providing a second detect signal, and wherein the step of coupling the values of the subsequent block of signal to said output terminal is done in response to both said first and second detect signals.

* * * * *